United States Patent [19]
Tomigashi et al.

[11] Patent Number: 5,541,834
[45] Date of Patent: Jul. 30, 1996

[54] CONTROL SYSTEM FOR COMPONENT MOUNTING APPARATUS

[75] Inventors: Yoshio Tomigashi, Neyagawa; Masaki Harada, Kadoma; Akira Sakaguchi, Kobe; Akihiro Hirao, Katano, all of Japan

[73] Assignee: Sanyo Electric Co., Ltd., Moriguchi, Japan

[21] Appl. No.: 321,846

[22] Filed: Oct. 14, 1994

[30] Foreign Application Priority Data

Oct. 15, 1993 [JP] Japan ................................. 5-258118

[51] Int. Cl.⁶ .................................................. G06F 19/00
[52] U.S. Cl. ...................... 364/167.01; 29/739; 29/743; 348/87; 364/559
[58] Field of Search ............................... 364/468, 474.35, 364/488–491, 559, 167.01; 382/145, 146, 147, 149, 151, 289, 294; 29/739–741, 743, 720, 721, 833, 834; 348/87, 95, 126; 250/559.34, 559.3, 559.37

[56] References Cited

U.S. PATENT DOCUMENTS 4,862,510  8/1989  Duncan et al. .......................... 382/145
5,140,643  8/1992  Izumi et al. ............................. 382/291
5,285,888  2/1994  Izume et al. ........................... 29/720 X

FOREIGN PATENT DOCUMENTS 62-13152    3/1987  Japan .
62-154700   7/1987  Japan .
63-122300   5/1988  Japan .
1-321700   12/1989  Japan .
3-217095    9/1991  Japan .

*Primary Examiner*—Joseph Ruggiero
*Attorney, Agent, or Firm*—Nikaido, Marmelstein, Murray & Oram LLP

[57] ABSTRACT

A component mounting apparatus having a suction nozzle movable with a component held attracted thereto to mount the component in a mounting position on a board comprises a CCD camera for taking images of the component and the mounting position obliquely from above when the suction nozzle has been brought to above the mounting position with the component held attracted thereto, an image processing circuit for calculating the deviation of the position of the component relative to the mounting position based on image signals from the camera, and a control circuit for correcting the position of the component by moving the suction nozzle in a horizontal plane in accordance with the calculated deviation.

8 Claims, 11 Drawing Sheets

CONTROL SYSTEM FOR COMPONENT MOUNTING APPARATUS

FIELD OF THE INVENTION

The present invention relates to a control system for use in component mounting apparatus which have a suction nozzle for holding an electronic part or like component attracted thereto to mount the component in position on a board, the control system being adapted to correct the position and rotated angle of the suction nozzle when the component is to be mounted, in accordance with the deviation of the position of the component as held by the suction nozzle relative to the position where the component is to be mounted on the board.

BACKGROUND OF THE INVENTION

Figure 12:
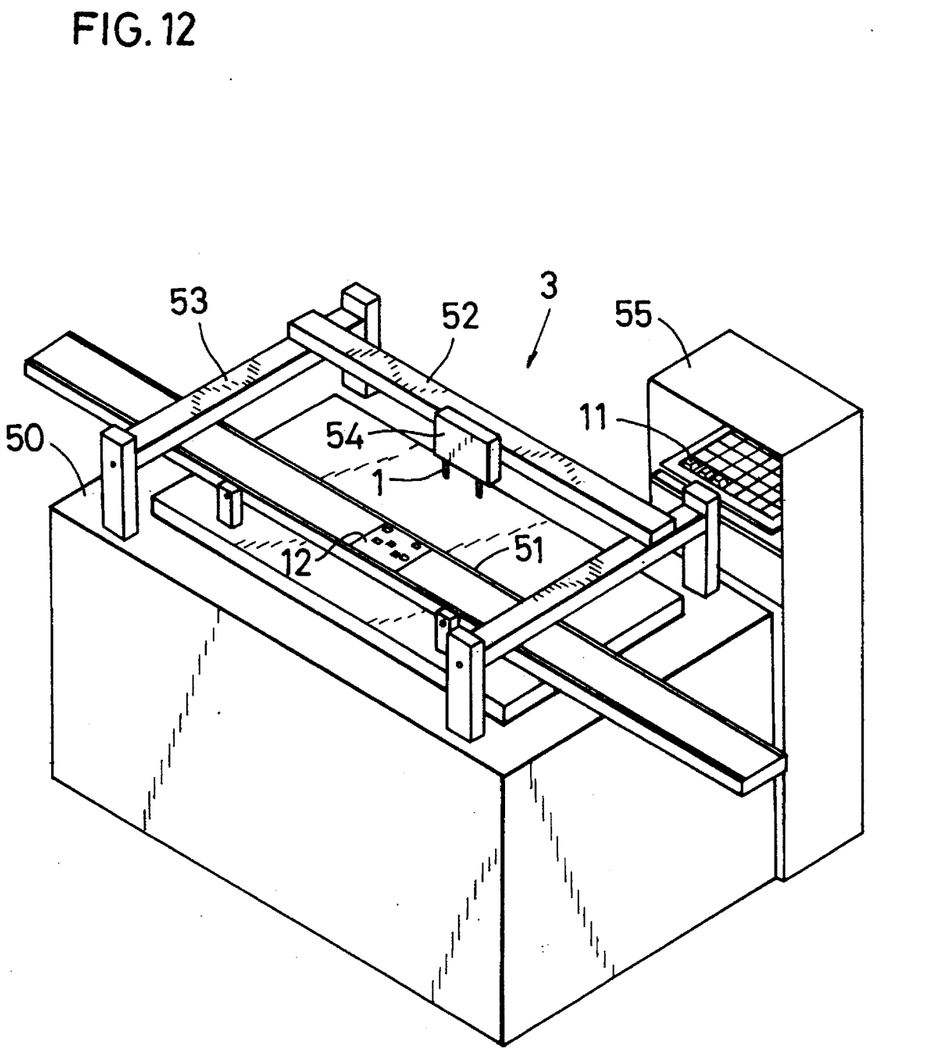
FIG. 12 is a perspective view showing the appearance of a component mounting apparatus.

FIG. 12 shows a mounting apparatus for electronic components which comprises a machine frame 50 provided with a transport rail 51 for printed boards 12, a drive mechanism 3 mounted on the machine frame 50 and comprising an X-axis table 52 and a Y-axis table 53, and a suction head 54 movable by the drive mechanism 3 in an X-axis direction and a Y-axis direction. The suction head 54 includes a suction nozzle 1 which is rotatable about a Z-axis by a rotating mechanism incorporated in the suction head 54.

The component mounting apparatus described is adapted to move the suction head 54 to a component feed station 55 by the drive mechanism 3, cause the suction nozzle 1 to hold a component 11 attracted thereto, thereafter move the component 11 to a specified position above the printed board 12, further cause the rotating mechanism to change the orientation of the component 11 and then mount the component 11 on the printed board 12.

To position the component 11 in place when it is to be mounted on the printed board 12, the following methods have heretofore been used.

Figure 13:
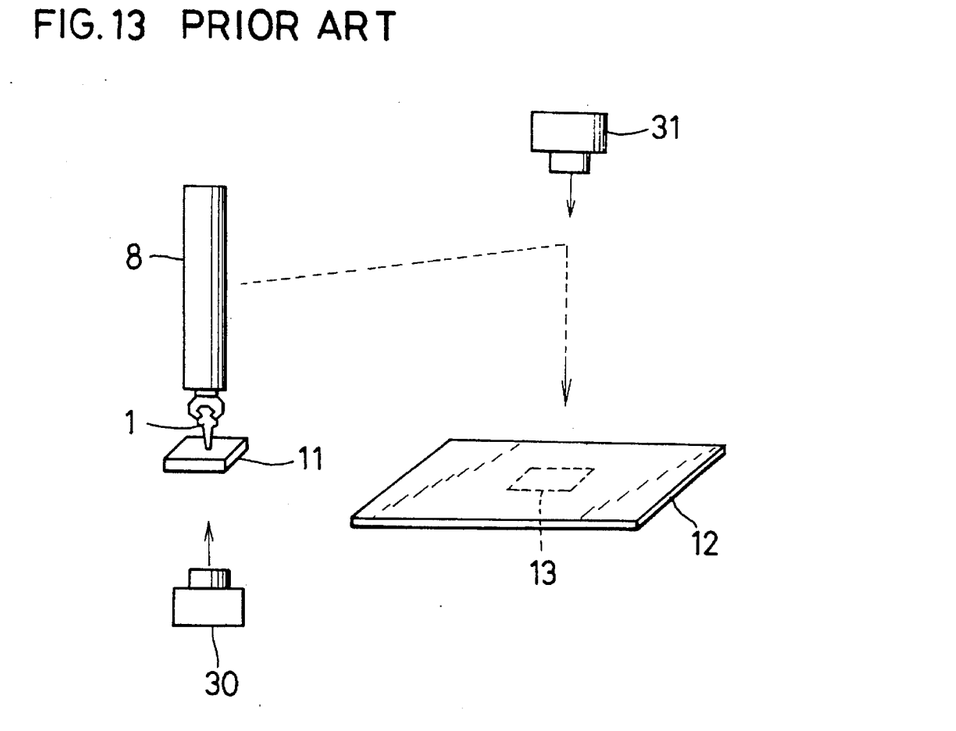
FIG. 13 is a diagram showing the construction of a conventional component mounting apparatus.

With reference to FIG. 13, an image of the component 11 as held by the suction nozzle 1 on a head body 8 is taken by one of two cameras 30, 31, i.e., by the camera 30, and an image of the position 13 where the component is to be mounted on the board 12 (mounting position) is taken by the other camera 31. The position of the component 11 held by the suction nozzle 1 and the mounting position 13 on the board 12 are detected based on the resulting image signals from the two cameras to correct the difference between the two positions.

Figure 14:
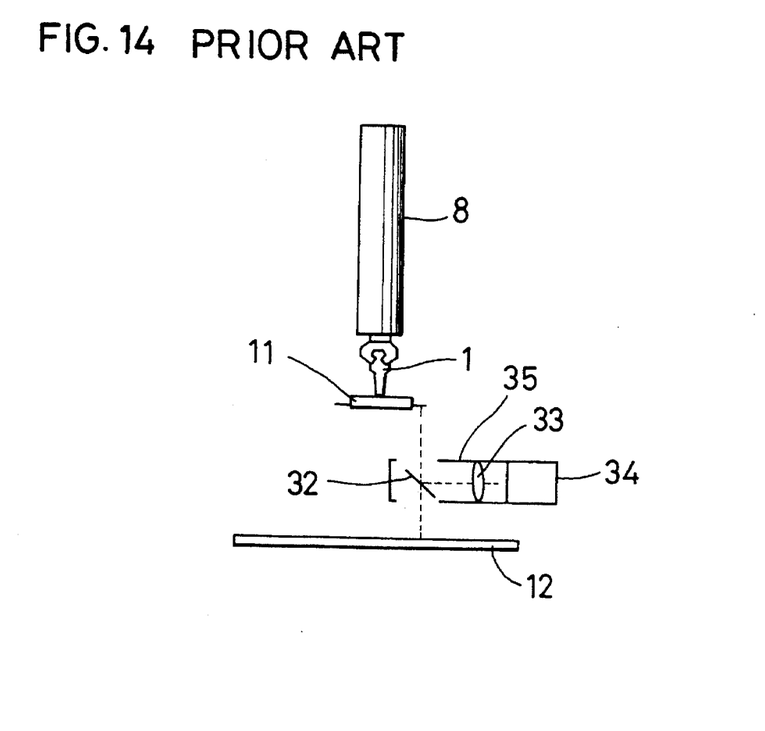
FIG. 14 is a diagram showing another conventional example.

FIG. 14 shows another arrangement wherein a half mirror 32 is rotatably provided between the printed board 12 and the component 11 as held attracted to the suction nozzle 1 and positioned above the printed board 12, and a camera 34 is disposed as opposed to the direction of reflection from the mirror 32 with an optical lens 33 interposed between the camera and the mirror. The lens 33 is housed in a lens barrel 35, which further has a shutter mechanism, barrel drive mechanism, etc. (not shown) incorporated therein. An image of the component 11 held by the suction nozzle 1 and an image of the mounting position on the printed board 12 can be taken by the camera 34 at the same time when the half mirror 32 is rotated. The position of the component 11 is matched to the mounting position based on the image signals from the camera 34 (Unexamined Japanese Patent Publication HEI 3-217095).

Figure 15:
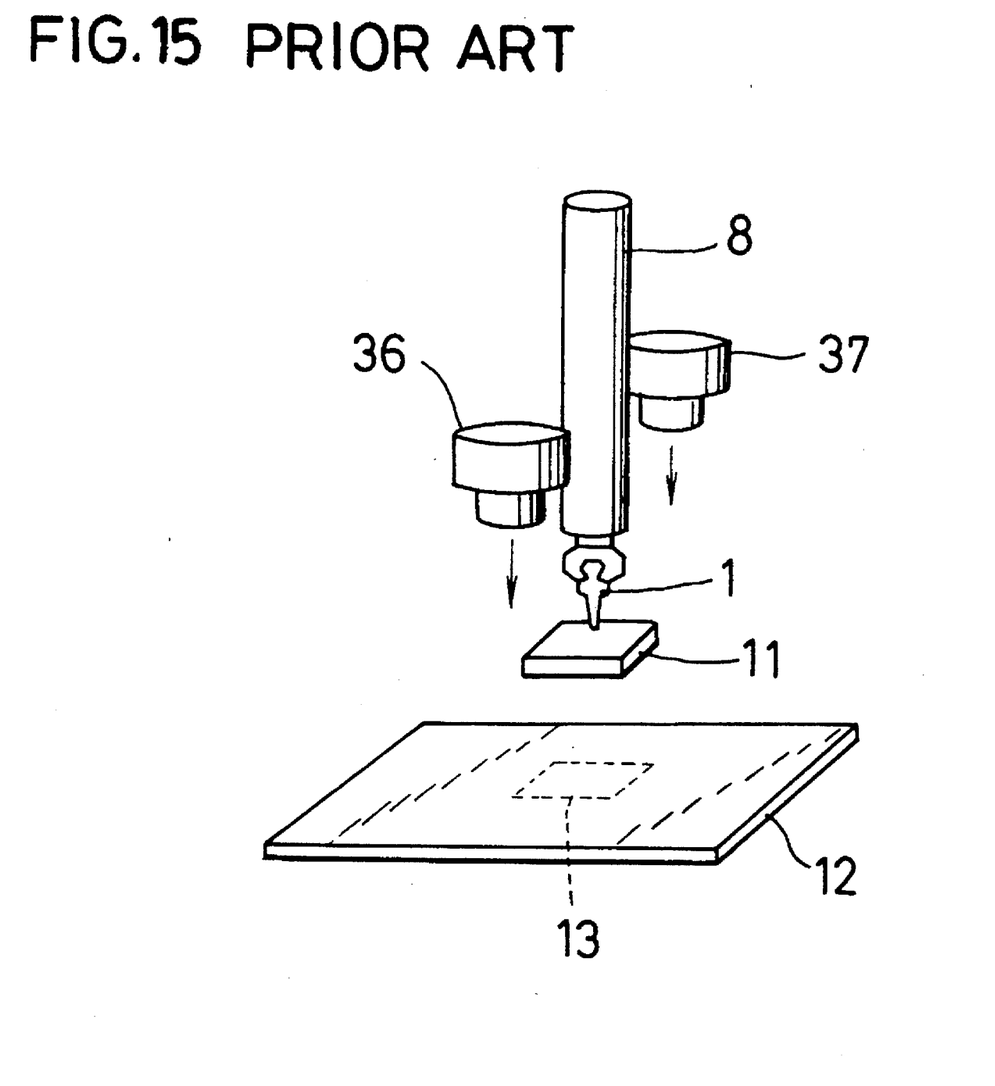
FIG. 15 is a diagram showing still another conventional example.

FIG. 15 shows another arrangement wherein two cameras 36, 37 are vertically attached to a suction head body 8. The two cameras 36, 37 first take images of corners of the component 11 as held by the suction nozzle 1 and positioned above the printed board 12, and then take images of the mounting position 13 with the component 11 rotated through 45 degrees. The position of the component 11 and the mounting position 13 are subsequently detected based on the image signals from the cameras 36, 37 to obtain a match between the two positions (Unexamined Japanese Patent Publication HEI 1-321700).

However, the conventional techniques described have the following problems. With the technique of FIG. 13, the component 11 is horizontally moved toward the printed board 12 and mounted thereon, after the position of the component 11 has been detected from the image taken thereof, so that the movement results in a new deviation, which makes it impossible to achieve a high mounting accuracy, With the technique of FIG. 14, the lens barrel 35 has the shutter mechanism, barrel drive mechanism, etc. incorporated therein and is therefore complex in construction. Further in the case of the technique of FIG. 15, the images of the component 11 and the mounting position 13 can not be taken within one picture frame at the same time. Accordingly, there arises a need to rotate the component 11 as stated above for taking the images of the mounting position 13, giving rise to the problem that acceptance of the image signals takes time.

Also proposed are other contrivances such as a transparent suction head body (Examined Japanese Patent Publication SHO 62-13152) and a suction head body which has a bent shape to avoid interference with the camera to be positioned above the component (Unexamined Japanese Patent Publications SHO 63-122300 and SHO 62-154700), whereas these suction heads are complex in construction and are not suited to actual use.

SUMMARY OF THE INVENTION

An object of the present invention is to provide a component mounting apparatus which is simple in construction and in which images can be taken of a component and the mounting position thereof in the same plane at the same time without the need to move the component.

The present invention provides a component mounting apparatus which comprises an image pick-up device for taking images of a component and a position of mounting thereof obliquely from above when a suction nozzle has been brought to above the mounting position with the component held attracted to the suction nozzle, arithmetic means for calculating the deviation of the position of the component relative to the mounting position based on image signals from the image pick-up device, and control means for correcting the position of the component by moving the suction nozzle in a horizontal plane in accordance with the calculated deviation.

More specifically, the image pick-up device comprises one or a plurality of cameras for imaging obliquely from above at least two corners of the component held attracted to the suction nozzle and the mounting position where the component is to be mounted on a printed board and which corresponds to the corners. In the case where the image pick-up device comprises one camera, the camera is so supported as to be revolvable about a vertical axis of a head body and is revolved to take images of the two corners.

When the image pick-up device comprises two cameras, one of the cameras takes an image of the first of the corners and the other camera an image of the second corner.

With the component mounting apparatus of the present invention, the image pick-up device takes the images of the component as held attracted to the suction nozzle and the mounting position obliquely from above, so that the images of the component and the mounting position can be captured in the same picture frame at the same time.

The image signals from the image pick-up device are input to the arithmetic means, which calculates the deviation of the component from the mounting position.

When images are taken of at least two corners of the component by the single camera or the plurality of cameras in this case, the deviation of the position of the component from the mounting position can be calculated based on the resulting image signals.

Further if the single camera or the plurality of cameras take images of a row of leads projecting from each of at least three sides of the electronic component and a row of pads on the board for the corresponding side, the deviation of position of the component from the mounting position can be calculated based on the resulting image signals.

The data as to the deviation thus calculated is fed to the drive mechanism of the component suction head to correct the position and posture of the component held attracted to the suction nozzle.

Since the component mounting apparatus control system of the present invention is adapted to take images of the component and the mounting position obliquely from above, the images of the position of the component and the mounting position are out of register with each other in the picture frame and can therefore be captured at the same time. This eliminates the need for a cumbersome movement such as movement of the component and nevertheless achieves a high accuracy in position matching. The control system is simple in construction since there is no need to use complex mechanisms such as the shutter mechanism and barrel drive mechanism conventionally employed.

DETAILED DESCRIPTION OF EMBODIMENTS

With reference to the drawings, a detailed description will be given below of electronic component mounting apparatus for mounting QFPs (quad flat packages) on printed boards.

With conventional common component mounting apparatus, electronic components are positioned in place for mounting with an accuracy of about ±40 μm. In this case, the limit of lead pitches of QFPs which are mountable is 0.3 mm. For example, when QFPs with a lead pitch of about 0.15 mm are to be mounted, the component needs to be positioned with a high accuracy of about ±20 μm by correcting the position of the component based on image data as is the case with the electronic component mounting apparatus of the invention to be described below.

Overall Construction of Mounter

Figure 1:
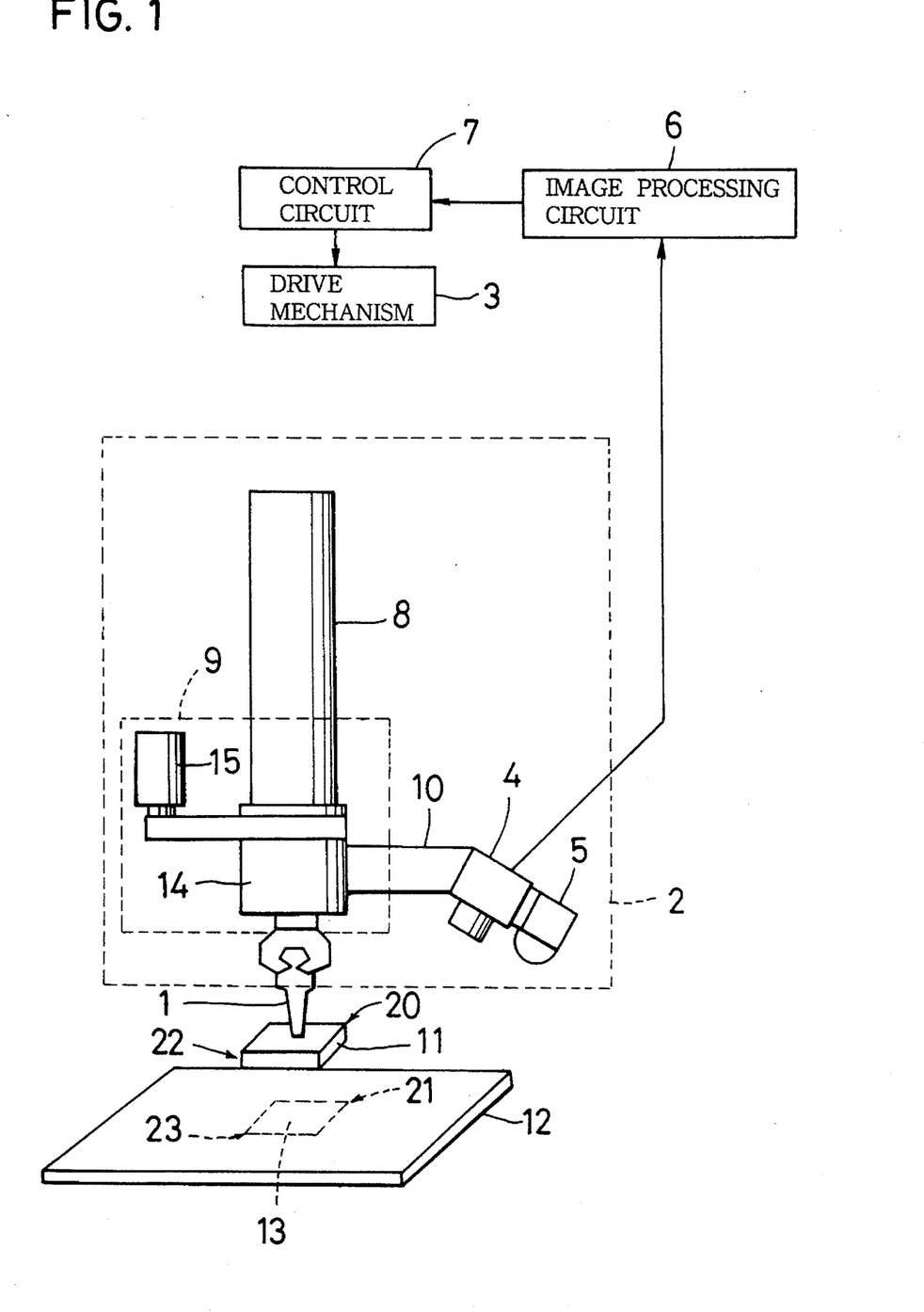
FIG. 1 is a diagram schematically showing the construction of a component mounting apparatus embodying the invention.

FIG. 1 schematically shows the construction of an electronic component mounting apparatus, in which a component suction head 2 is attached to a drive mechanism 3 comprising an X-axis table and a Y-axis table as in the prior art. Although the suction head 2 has coupled thereto a lift mechanism for moving the suction nozzle 1 upward and downward to attract and mount an electronic component 11, the lift mechanism has the same construction as the conventional one, is therefore not illustrated and will not be described.

The suction head 2 comprises a head body 8 provided with a suction nozzle 1 and movable upward and downward. A CCD camera 4 and an illuminator 5, which are positioned as inclined with respect to the head body 8, are attached to a camera drive assembly 9 by a camera mount block 10. The inclination of the camera 4 and the illuminator 5 is about 30 degrees with respect to a vertical axis.

The camera drive assembly 9 comprises a rotating mechanism 14 and a motor 15. The CCD camera 4 and the illuminator 5 can be revolved about the head body 8 by revolving the mount block 10 by the drive assembly 9.

First Embodiment

The electronic components to be mounted by the present embodiment are QFPs which are 0.15 mm in lead pitch.

When mounting the electronic component 11, the component suction head 2, carrying the component 11 as held attracted to the suction nozzle 1, is horizontally moved by the operation of the drive mechanism 3 to above a mounting position where the component 11 is to be mounted on a printed board 12.

Figure 2:
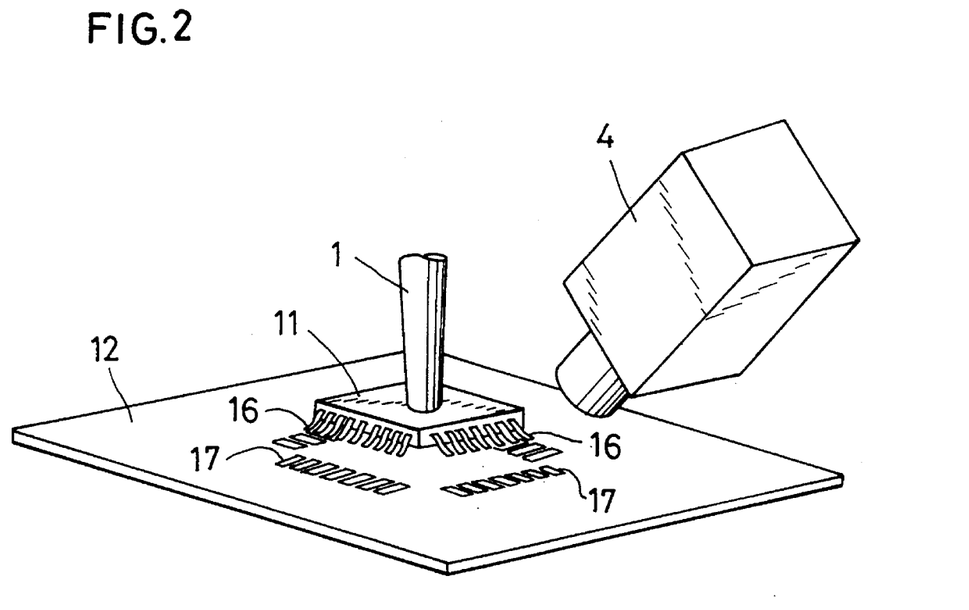
FIG. 2 is a perspective view showing how images are taken of a row of leads of an electronic component and a row of pads on a printed board by an image pick-up device.

The suction nozzle 1 is thereafter lowered by the lift mechanism to a level at which as seen in FIG. 2, images can be taken by the camera 4 of a row of leads 16 of the component 11 and a row of pads 17 on the printed board 12 at the same time, for example, to a level 0.5 mm above the board. At this time, the position of the component 11 generally involves an error of ±40 μm relative to the specified mounting position on the board 12. This error includes deviations $\Delta X$ and $\Delta Y$ in the direction of X-axis and the direction of Y-axis on a horizontal plane, and an error $\Delta \theta$ involved in the angle of rotation about the center axis of the suction nozzle 1.

The CCD camera 4 then takes an image of the row of leads 16 projecting from each of three sides of the component 11 as held to the nozzle 1 and, at the same time, an image of the row of pads 17 formed on the board 12 and corresponding to these leads 16. In this step, the camera 4 is first set as oriented perpendicular to the first side of the component 11, namely as so oriented that the horizontal component of vector of the image-taking direction is parallel to the longitudinal direction of the pads, and takes the images of the lead row and the pad row along the longitudinal direction. The camera 4 is thereafter revolved about the suction nozzle 1 through 90 degrees, takes like images for the second side, is further revolved through 90 degrees and takes like images for the third side. Since the camera 4 is inclined and takes the images of the lead and pad rows along each of these sides from an oblique direction, the lead row image and the pad row image taken are in different positions in accordance with the inclination.

Figure 3:
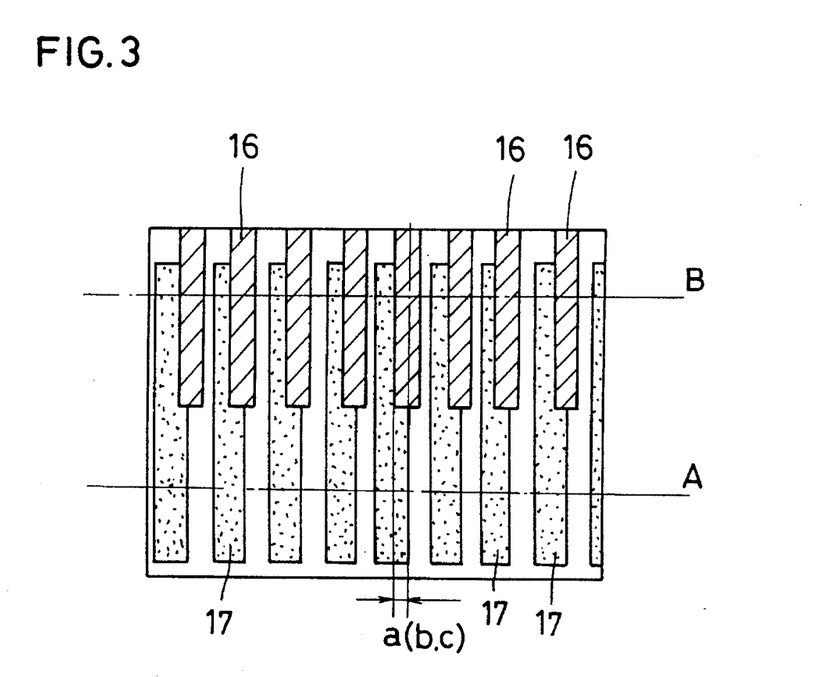
FIG. 3 is a diagram showing the images of the lead row of the electronic component and the pad row on the printed circuit.

FIG. 3 shows the images taken by the camera 4 for the first side of the component 11. It is seen that the image of leads 16 laps over that of pads 17 with a phase difference (a) present between the lead row and the pad row. Similarly, there is a phase difference (b) or (c) between the lead row and the pad row in the case of the second or third side of the component 11.

Accordingly, the resulting image signals are fed from the camera 4 to an image processing circuit 6, wherein within a predetermined frame of specified size as shown in FIG. 3, the image of pads 17 and the image of leads 16 are scanned in a direction orthogonal to the longitudinal direction of pads as indicated in broken lines A, B to detect variations in the optical density of the images along the scan lines. The lead surface or pad surface reflects light, and the image thereof exhibits a higher optical density value than the other image portions.

Figure 5:
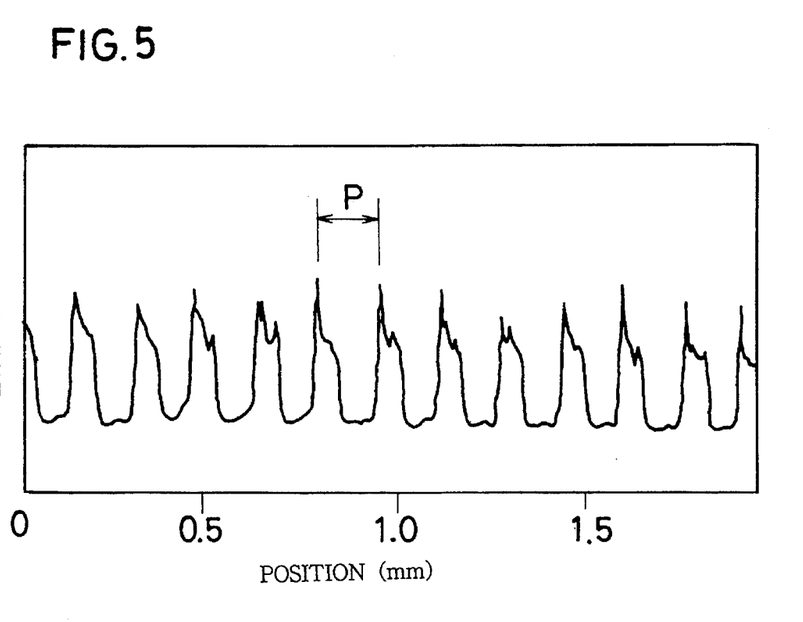
FIG. 5 is a graph showing variations in the optical density of the image of the lead row.

FIG. 5 shows the waveform of variations in the optical density value of the lead row image. The waveform represents a frequency component with a period matching the lead pitch P (0.15 mm). Similarly the waveform of variations in the optical density value of the pad row image shows a frequency component with a period matching the lead pitch P (0.15 mm).

As seen in FIG. 3, the image of pads 17 is present beneath the image of leads 16 in lapping relation, whereas the pad portion shadowed by the lead 16 is not fully illuminated, therefore exhibits a much lower optical density than the image of the lead 16 and is hardly recognized as an image. Consequently the density variation waveform of the lead row exhibits no influence of optical density of the pad row.

The image processing circuit 6 of FIG. 1 further obtains the FFTs (fast Fourier transforms) of density variation waveforms of the lead row and the pad row to consequently derive the phase of the frequency component having a period corresponding to the lead pitch of the component 11 and to calculate the difference between the lead row phase and the pad row phase. The phase difference thus obtained represents the difference between the lead row and the pad row in position.

The reflectance of the lead surface or the pad surface is not uniform, and the density variation waveform contains a plurality of frequency components as shown in FIG. 5. However, by extracting the frequency component having a period matching the lead pitch by the FFT, the influence of other frequency components as noise can be effectively removed. As a result, the deviation of the lead row from the pad row can be detected with a high accuracy.

Figure 6:
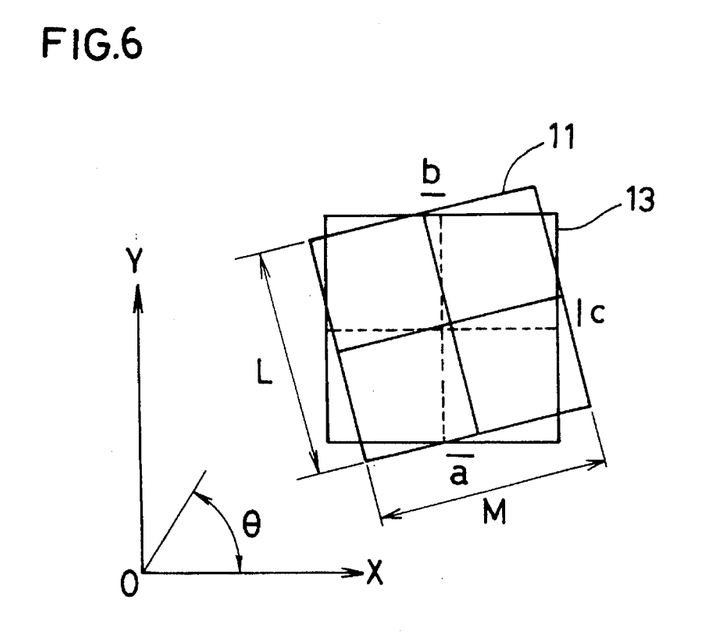
FIG. 6 is a diagram showing deviations of the position of the component from the position of mounting thereof on the board with respect to three directions.

FIG. 6 shows the three deviations a, b, c detected by imaging from the foregoing three directions the electronic component 11 deviating from the mounting position 13. The size of the component 11 is expressed by L multiplied by M.

In the case where the component 11 is held attracted at its central position by the suction nozzle 1, the deviation $\Delta X$ of the component 11 in the X-axis direction, the deviation $\Delta Y$ thereof in the Y-axis direction and the deviation $\Delta \theta$ thereof in the direction of rotation can be geometrically calculated from the following equations.

$$\Delta X = (a-b)/2 \tag{1}$$

$$\Delta Y = c - M(a+b)/2L \tag{2}$$

$$\Delta \theta = \sin^{-1} (a+b)/L \approx (a+b)/L \ (\because \theta \approx 0) \tag{3}$$

However, $\Delta X$ and $\Delta Y$ are given by the following equations in the case where the position of attraction by the suction nozzle 1 is not the center of the component 11. In these equations, the coordinates of the position of attraction by the suction nozzle are $(X_0, Y_0)$ relative to the center of the mounting position 13 as the origin. The coordinates $(X_0, Y0_0)$ can be calculated, for example, by taking images of the suction nozzle 1 and the component 11 with a camera fixedly disposed below the mounting position and processing the resulting images by a known method.

$$\begin{aligned}\Delta X &= \{(a-b)/2 - X_0\}\cos\Delta\theta + \\ &\quad \{c - M(a+b)/2L - Y_0\}\sin\Delta\theta + X_0 \approx \\ &\quad (a-b)/2\end{aligned} \tag{4}$$

$$\begin{aligned}\Delta Y &= -\{(a-b)/2 - X_0\}\sin\Delta\theta + \\ &\quad \{c - M(a+b)/2L - Y_0\}\cos\Delta\theta + Y_0 \approx \\ &\quad -\{(a-b)2 - X_0\}(a+b)/L + \\ &\quad c - M(a+b)/2L\end{aligned} \tag{5}$$

Figure 4:
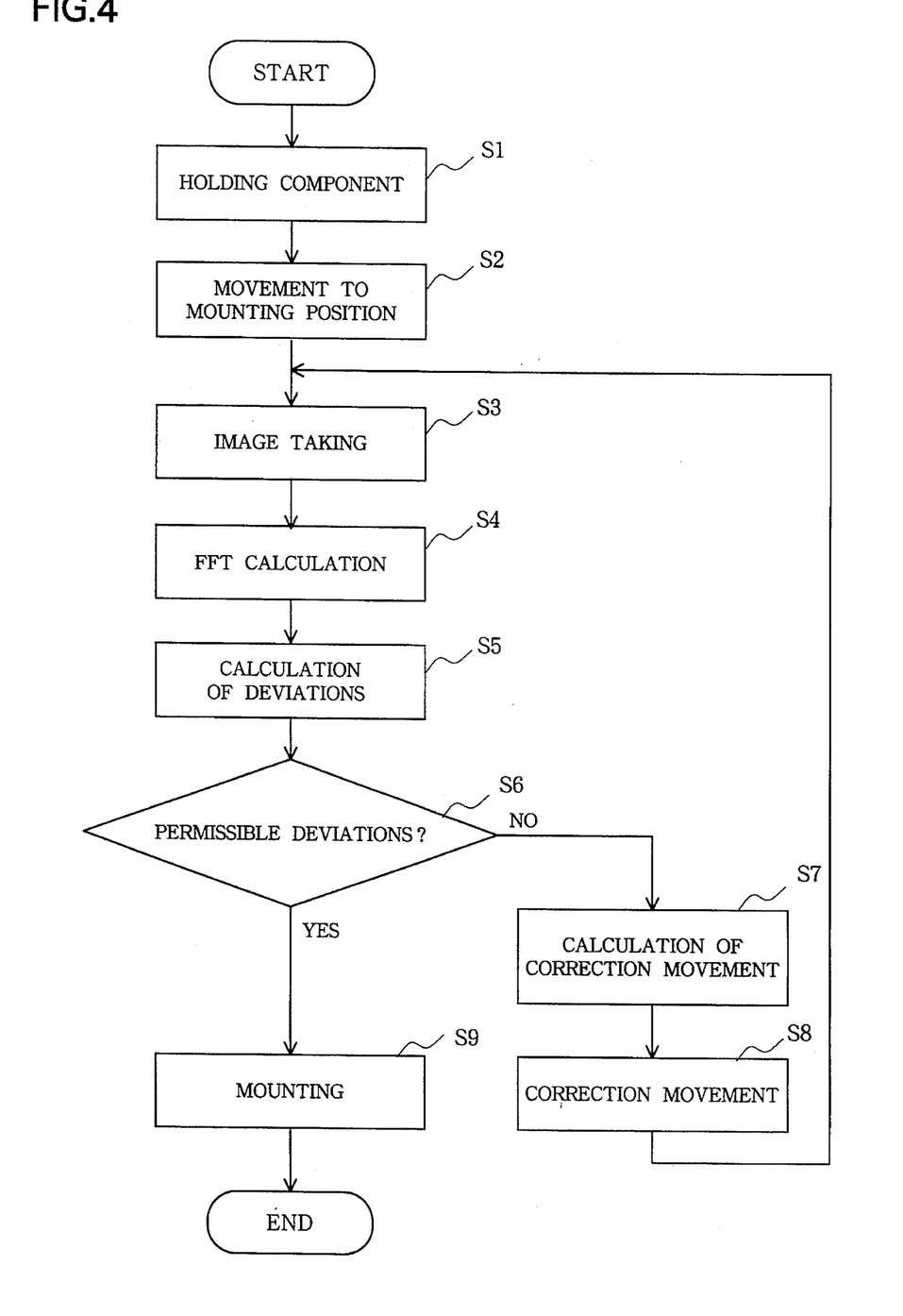
FIG. 4 is a flow chart showing a control procedure starting with attraction of the component and ending with mounting.

FIG. 4 shows a control procedure wherein the foregoing deviation calculation method is used for mounting the component.

First in step S1, an electronic component 11 is attracted from the component feed station 55 by the suction nozzle 1 and thereby held. The drive mechanism 3 operates in step S2 to move the suction head 54 to a position immediate above the mounting position.

Next in step S3, the lead row along each of the first to third sides of the component 11 is held attracted to the nozzle 1 and the corresponding pad row on a printed board are successively imaged while revolving the CCD camera 4 and the illuminator 5 by the camera drive assembly 9 through 90 degrees at a time.

In step S4, FFT calculations are done for the images obtained. The deviations of the lead row from the pad row for the three sides of the component are then calculated in step S5.

Subsequently step S6 inquires whether the deviations are within a permissible range. If the answer is negative, step S7 calculates the amount the suction nozzle 1 is to be moved for correction to reduce the deviations to the permissible range. The suction nozzle 1 is moved for correction in step S8, whereupon the sequence returns to step S3.

When the deviations are subsequently found to be within the permissible range in step S6, step S9 follows, in which the suction nozzle 1 is lowered vertically to mount the component on the printed board.

A component mounting operation was conducted 50 times with use of the drive mechanism 3 which was 1 μm and 0.01 degree in minimum moving step to substantiate the accuracy of positioning achieved. FIGS. 7A to 7D show the result obtained. In mounting a component each time, the correction process of steps S3 to S8 shown in FIG. 4 was repeated 3 times to check how deviations diminished.

Figure 7A:
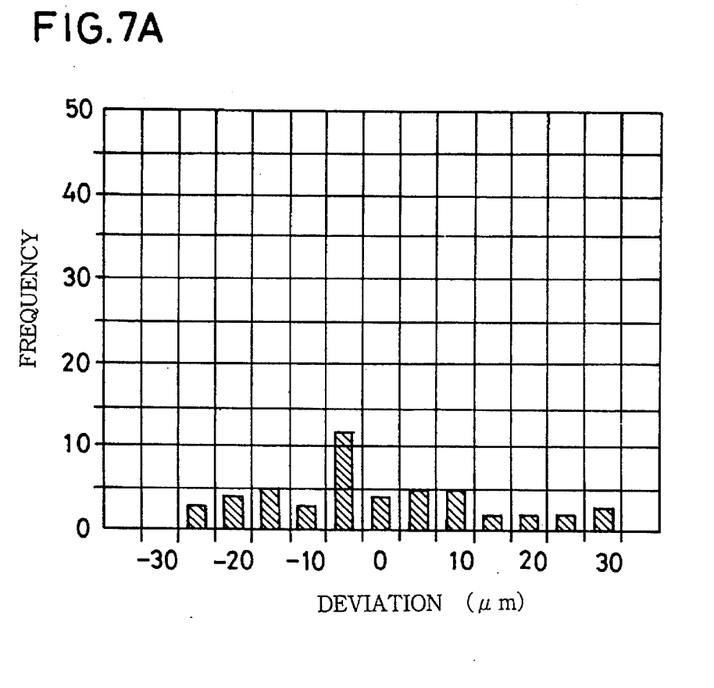
FIGS. 7A, 7B, 7C and 7D are histograms showing how deviations in the position are made to approach zero by repeatedly correcting the deviations according to the invention.
Figure 7B:
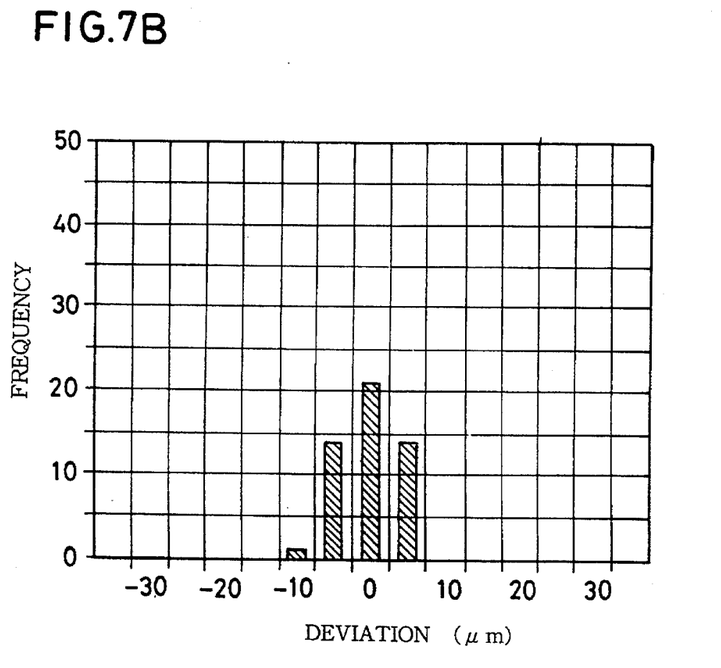
Figure 7C:
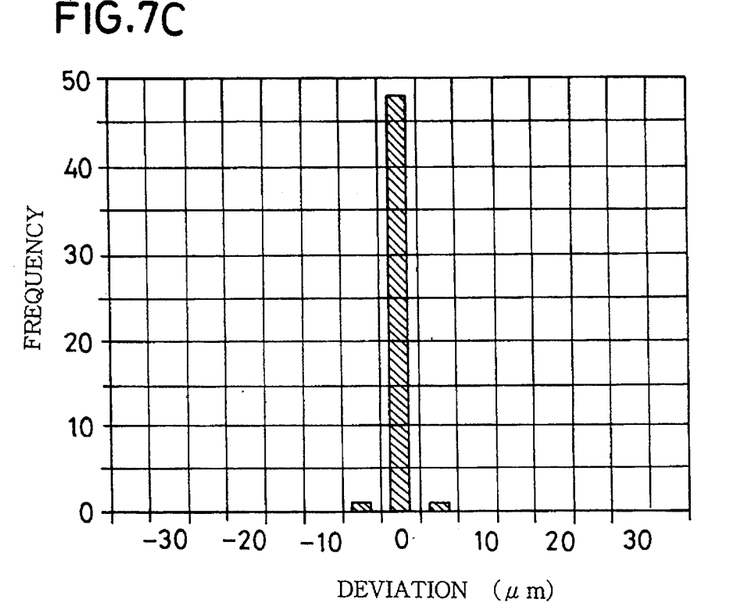
Figure 7D:
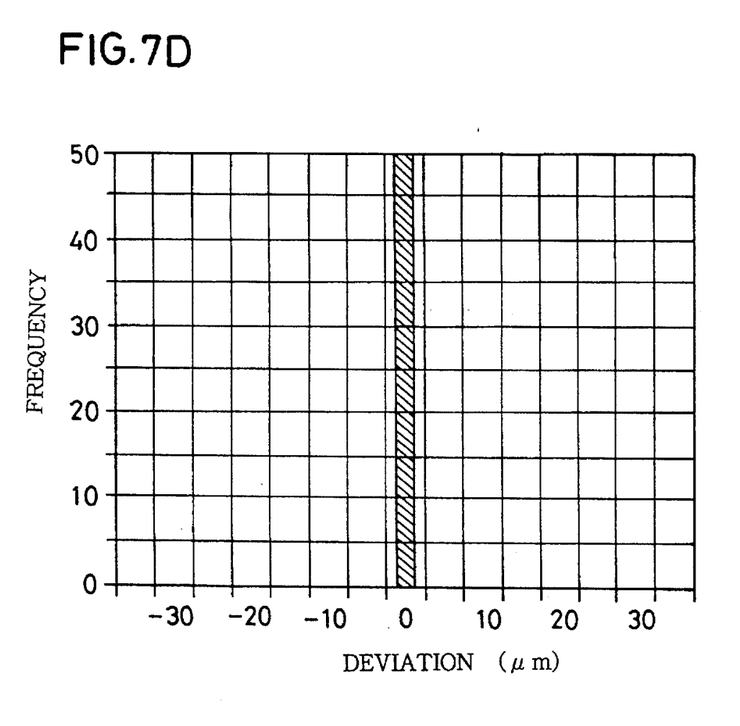

As shown in FIG. 7A, the deviations before correction vary greatly over the range of ±30 μmm. As seen in FIG. 7B, the deviations are diminished to the range of ±10 μm by executing the correction process once. The deviations are reduced to the range of ±5 μm by executing the correction process twice as shown in FIG. 7C. When executed 3 times, the correction process reduces the deviations almost to zero as shown in FIG. 7D.

In mounting QFPs with a lead pitch of 0.15 mm, the positioning accuracy to be realized is ±20 μm as previously stated, so that the correction process achieves a satisfactory result when executed once.

In the case where the inclination of the CCD camera 4 is changeable in the component mounting apparatus described, the deviation of position of the component 11 can be calculated in the same manner as above, so that favorable illumination conditions can be readily realized, for example, by adjusting the orientation of the camera 4 as well as of the illuminator 5.

For the calculation of deviations based on image processing, recognition of images by pattern matching or edge detection can be resorted to instead of the FFT.

Second Embodiment

According to the first embodiment described, the deviation of position of the electronic component 11 is detected with reference to leads 16 thereof using the CCD camera 4, while the second embodiment is adapted to detect deviations with reference to corners of the component 11. The present embodiment is therefore useful for mounting electronic components having no outward leads.

The control of revolution of the CCD camera 4 is effected manually or automatically depending on whether the component 11 and the lead pitch thereof are large or small. When the component 11 is small, an image of the entire component 11 can be taken by the camera 4 in a fixed position, but if the component 11 is great, an image of only a portion of the component 11 can be taken from the fixed position. Further in the case where the component 11 has a great lead pitch, there is no need for enlargement by zooming the camera, whereas in the case of a small lead pitch, an enlarged image needs to be obtained by zooming to process the image with a higher accuracy. Since the enlarged image of the component 11 is obtained in the latter case, the entire component 11 can not be imaged in a single picture frame if the camera 4 is in a fixed position. In such a case, therefore, the CCD camera 4 is revolved to take images of at least two corners.

Incidentally, it is possible to fix two cameras to the head body 8 for imaging two corners with these cameras instead of revolving the single camera 4 by the camera drive assembly 9, whereby the time taken for accepting the images can be shortened. However, when the component 11 is small or has a great lead pitch, the component can be imaged in its entirety by the single camera.

In mounting the component, the suction head 2 is moved to above the mounting position 13 by the drive mechanism 3 and thereafter lowered by the aforementioned lift mechanism to a level where the component 11 and the mounting position 13 can be imaged by the camera 4, for example, to a level 0.5 mm above the board.

A. When the component 11 is small or the lead pitch is great

In this case, the camera 4 takes images of the component 11 and the mounting position 13 each in its entirety. Since the imaging direction is oblique, the images of the component 11 and the mounting position 13 can be captured without register within a single picture frame.

The image signals from the CCD camera 4 are fed to the image processing circuit 6, which in turn calculates deviations of the component 11 from the mounting position 13, i.e., deviations ΔX and ΔY in the X-axis direction and the Y-axis direction and a deviation Δθ in angle of rotation as previously described.

Figure 8:
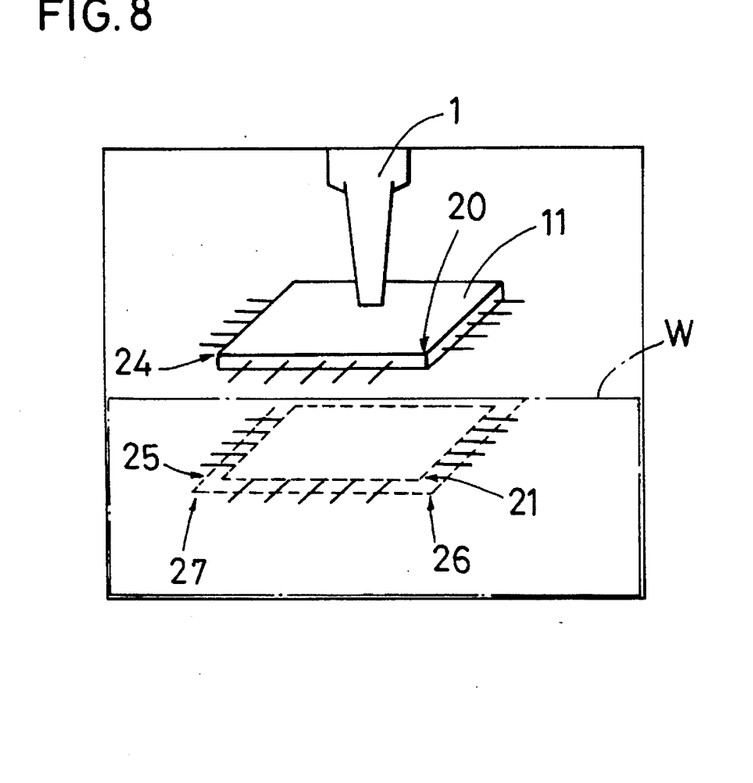
FIG. 8 is a diagram showing a relatively small component in its entirety and an image of mounting position.
Figure 9:
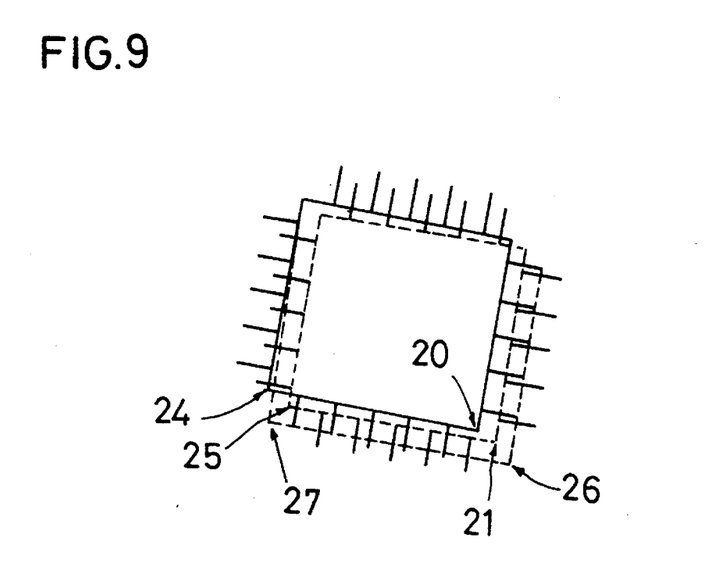
FIG. 9 is a diagram showing the image as converted to an X–Y coordinate system on a horizontal plane.

FIG. 8 shows a rectangular frame of specified size set in the images taken by the camera 4, and FIG. 9 shows the image within the frame, as converted to an X–Y coordinate system. First based on the image signal of FIG. 8, the vertices of two corners 20 and 24 of the component are searched for by pattern matching. Next based on the positions of the respective vertices and with respect to the image W in the image area other than the component 11, i.e., with respect to the image of mounting position on the board, an intermediate position of each pad on the board is determined. The image of each pad can be recognized, for example, by converting the image to binary values or by like known method. The intermediate positions thus obtained are interconnected by straight lines to determine intersections 26, 27 of the lines. Mounting positions 21, 25 corresponding to the corners 20, 24 of the component 11 are determined from the positions of these intersections 26, 27 and data as to the length of pads already known.

The imaged positions of the component corners 20, 24 and the mounting positions 21, 25 on the image are then converted to the X–Y coordinate system on a horizontal plane as shown in FIG. 9, whereby the deviations ΔX, ΔY and Δθ of the component corners 20, 24 relative to the mounting positions 21, 25 are calculated.

B. When the component 11 is large or the lead pitch is small

Figure 10A:
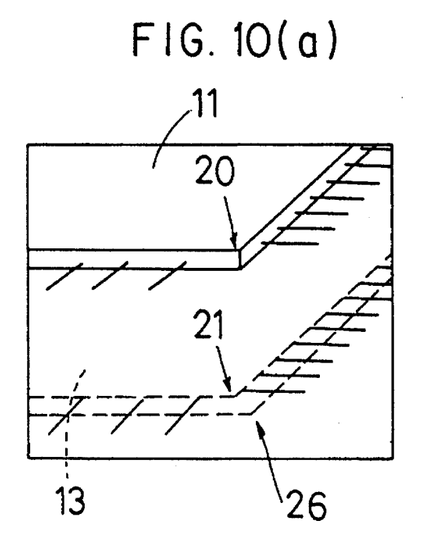
FIG. 10A is a diagram showing images of a corner of a relatively large component and a mounting position corresponding to the corner.
Figure 10B:
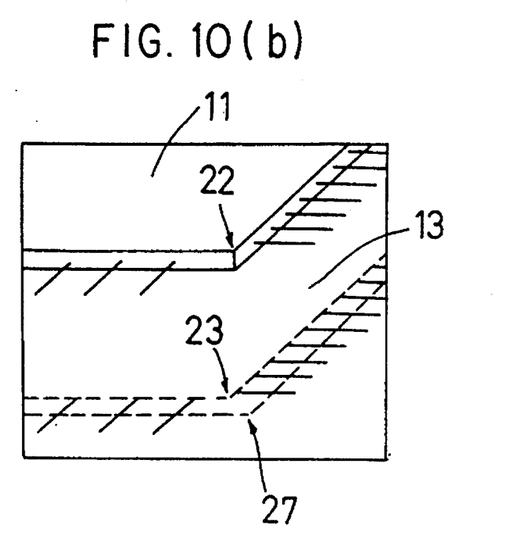
FIG. 10B is a diagram showing images of another corner of the component and a mounting position corresponding to the corner.

FIGS. 10A and 10B each show a rectangular frame of specified size set in an image taken by the CCD camera 4.

As shown in FIG. 10A, the camera 4 images a first corner 20 of the component 11 and a mounting position 21 corresponding to the corner at the same time. The camera 4 and the illuminator 5 are thereafter revolved about the suction head body 8 through 180 degrees by the camera drive assembly 9 to image a second corner 22 of the component 11 and a mounting position 23 corresponding to the corner at the same time as shown in FIG. 10B.

The image signals from the camera 4 are fed to the image processing circuit 6 as in the foregoing case. The circuit calculates deviations ΔX and ΔY of the component 11 from the mounting position 13 with respect to the X-axis and Y-axis directions and a deviation Δθ of the same in angle of rotation.

Figure 11:
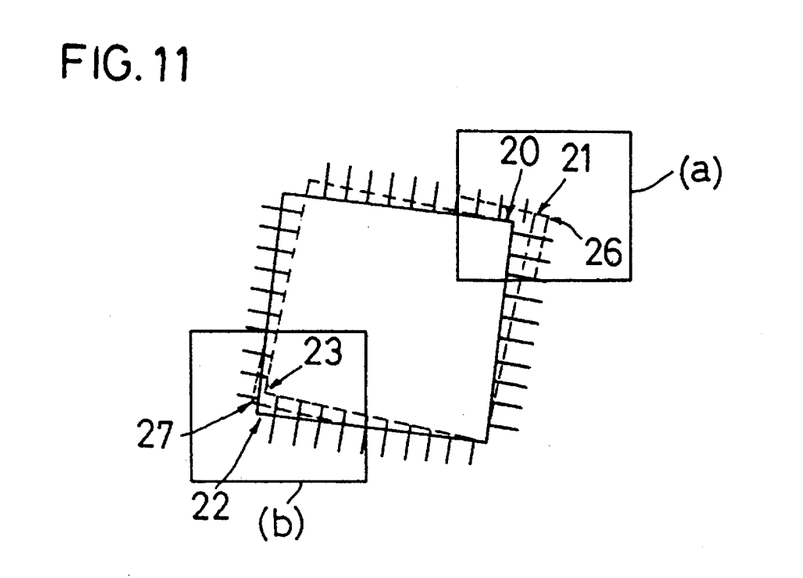
FIG. 11 is a diagram showing the images of FIGS. 10A and 10B as converted to an X–Y coordinate system on a horizontal plane.

FIG. 11 shows the two images (a) and (b) of FIGS. 10A and 10B as converted to an X–Y coordinate system on a horizontal plane.

The image signals of FIGS. 10A and 10B are processed in the same manner as already stated, whereby the positions of the component corners 20, 22 and the mounting positions 21, 23 corresponding thereto are obtained. These positions are further converted to coordinates on a horizontal plane as shown in FIG. 11 to calculate deviations $\Delta X$, $\Delta Y$ and $\Delta \theta$ of the positions of the corners 20, 22 of the component 11 relative to the mounting positions 21, 23.

The results of calculations of the deviations are fed to a control circuit 7 shown in FIG. 1. The control circuit 7 prepares deviation correcting signals for the drive mechanism 3 and the suction head 2. These signals correct the position of the suction head 2 with respect to the X-axis and Y-axis directions and the angle of rotation of the suction nozzle 1.

As already described, the component mounting apparatus embodying the invention takes images of an electronic component and the mounting position thereof obliquely from above, so that the images can be captured at the same time within the same picture frame, consequently eliminating the need for a cumbersome movement such as movement of the component. Further after the images have been taken, the suction head moves only vertically. This realizes position matching with a high accuracy. The mounter is further simple in construction since there is no need for the complex mechanisms, such as shutter mechanism and lens barrel drive mechanism, which are used conventionally.

The foregoing description of the embodiments is intended to illustrate the present invention and should not be construed as limiting the invention as defined in the appended claims or reducing the scope thereof. Furthermore, the mounter of the invention is not limited to the foregoing embodiments in construction but can of course be modified variously without departing from the spirit of the invention as set forth in the claims.

For example, images of the component 11 and the mounting position 13 are taken at the same time in the case of the foregoing two embodiments, whereas the camera can be focused on the component 11 first for imaging and then on the mounting position 13 for imaging.

What is claimed is:

1. A control system for a component mounting apparatus for moving a suction nozzle with a component held attracted thereto and mounting the component in a mounting position on a board, the control system comprising:

an image pick-up device disposed in an inclined position with respect to a vertical axis on the board for imaging the component and the mounting position obliquely from above when the suction nozzle has been brought to above the mounting position with the component held attracted to the suction nozzle, arithmetic means for calculating the deviation of the position of the component relative to the mounting position based on image signals from the image pick-up device, and control means for correcting the position of the component by moving the suction nozzle in a horizontal plane in accordance with the calculated deviation.

2. A control system for a component mounting apparatus as defined in claim 1 wherein the image pick-up device comprises a single camera revolvable about the suction nozzle as required for capturing each of at least two corners of the component held attracted to the suction nozzle within a single picture frame the corner and a mounting position on the board corresponding to the corner.

3. A control system for a component mounting apparatus as defined in claim 1 wherein the image pick-up device comprises a plurality of cameras for respectively imaging at least two corners of the component held attracted to the suction nozzle, and each of the cameras captures within a single picture frame the corner of the component and a mounting position on the board corresponding to the corner.

4. A control system for a component mounting apparatus as defined in claim 1 wherein based on pattern matching for images of at least two corners of the component, the arithmetic means calculates deviations in the position of the component from the mounting position with respect to three directions.

5. A control system for a component mounting apparatus for use with an electronic component and a printed board, the electronic component comprising a quadrilateral flat body and a multiplicity of leads projecting from each of the four peripheral sides of the body, the printed board having a multiplicity of pads formed in a mounting position for the component for the respective leads to be joined thereto, the component mounter comprising a suction nozzle for holding the electronic component attracted thereto, and a moving mechanism for moving the suction nozzle and mounting the attracted component on the printed board, the control system comprising:

an image pick-up device disposed in an inclined position with respect to a vertical axis on the printed board for imaging the electronic component and the mounting position obliquely from above when the suction nozzle has been brought to above the mounting position with the component held attracted to the nozzle, an imaging direction adjusting mechanism for adjusting the orientation of the image pick-up device when images are to be taken by the device so that the horizontal component of a vector representing the imaging direction is parallel to the longitudinal direction of the pads on the printed board for the image pick-up device to capture the leads projecting from one side of the component and the pads corresponding to these pads within a single picture frame, arithmetic means for calculating the deviation of the position of the component relative to the mounting position based on image signals as to at least three sides of the electronic component imaged by the image pick-up device, and control means for correcting the position of the component by moving the suction nozzle in a horizontal plane in accordance with the calculated deviation.

6. A control system for a component mounting apparatus as defined in claim 5 wherein the image pick-up device comprises a single camera revolvable about the suction nozzle as required for capturing each of at least three sides of the electronic component held attracted to the suction nozzle within a single picture frame the leads projecting from the side and the pads on the board corresponding to these leads.

7. A control system for a component mounting apparatus as defined in claim 5 wherein the image pick-up device comprises a plurality of cameras for respectively imaging at least three sides of the electronic component held attracted to the suction nozzle, and each of the cameras captures within a single picture frame the leads projecting from the side of the component and the pads on the board corresponding to these leads.

8. A control system for a component mounting apparatus as defined in claim 5 wherein the arithmetic means comprises:

density detecting means for comparing an image of the leads projecting from one side of the electronic component and an image of the pads on the printed board to detect variations in the optical density of each image in the direction of arrangement of the pads, phase difference detecting means for detecting a phase difference between the arrangement of the leads and the arrangement of the pads by subjecting the detected density variations of the lead arrangement and the pad arrangement to the Fourier transform, and deviation calculating means for calculating deviations of position of the electronic component from the mounting position with respect to three directions based on at least three phase differences detected for at least three sides of the electronic component.

* * * * *